United States Patent [19]

Adriaensen et al.

[11] Patent Number: 5,137,782

[45] Date of Patent: Aug. 11, 1992

[54] GRANULAR COMPOSITE CONTAINING METAL FIBERS AND PLASTIC ARTICLES MADE THEREFROM

[75] Inventors: Ludo Adriaensen, Deerlijk; Frans Verhaeghe, Kortrijk-Heule, both of Belgium

[73] Assignee: N. V. Bekaert S.A., Zwevegem, Belgium

[21] Appl. No.: 494,801

[22] Filed: Mar. 13, 1990

Related U.S. Application Data

[63] Continuation of Ser. No. 178,328, Apr. 6, 1988, abandoned.

[30] Foreign Application Priority Data

Apr. 6, 1987 [BE] Belgium ............................. 8700357

[51] Int. Cl.$^5$ ................................................. B32B 5/06
[52] U.S. Cl. ..................................... 428/370; 428/294; 428/295; 428/364; 428/369; 428/372; 428/407; 428/592; 428/602
[58] Field of Search ............... 428/294, 295, 364, 372, 428/407, 592, 602, 369, 370

[56] References Cited

U.S. PATENT DOCUMENTS

| 2,050,298 | 8/1936 | Everett. | |
|---|---|---|---|
| 3,277,564 | 10/1966 | Webber et al. | |
| 3,862,287 | 1/1975 | Davis | 427/375 X |
| 3,883,371 | 5/1975 | Geary | 428/592 X |
| 3,993,726 | 11/1976 | Moyer | 264/174 |
| 4,104,445 | 8/1978 | Dobo | 428/602 X |
| 4,312,917 | 1/1982 | Hawley | 428/375 |
| 4,500,595 | 2/1985 | Gerteisen et al. | 428/294 |
| 4,664,971 | 5/1987 | Soens | 428/294 |
| 4,788,104 | 11/1988 | Adriaensen et al. | 428/294 |

FOREIGN PATENT DOCUMENTS

| 0208873 | 1/1987 | European Pat. Off. | 428/373 |
|---|---|---|---|
| 0286168 | 10/1988 | European Pat. Off. | |
| 57-65754 | 4/1982 | Japan. | |
| 2150936A | 7/1985 | United Kingdom. | |

OTHER PUBLICATIONS

Encyclopedia of Polyemer Science and Engineering, vol. 14, John Wiley & Sons, pp. 327–403.

Primary Examiner—George F. Lesmes
Assistant Examiner—Beverly A. Pawlikowski
Attorney, Agent, or Firm—Nixon & Vanderhye

[57] ABSTRACT

The granular composite is obtained by chopping a composite strand containing metal fibers, said fibers being embedded as bundles in a plastic and is to be used for the shaping of plastic articles. The metal fibers comprise hardened material which has been derived from an austenitic ferric alloy in which the austenite has been converted into martensite for at least 75 vol. %.

22 Claims, No Drawings

GRANULAR COMPOSITE CONTAINING METAL FIBERS AND PLASTIC ARTICLES MADE THEREFROM

This is a continuation of application Ser. No. 07/178,328, filed Apr. 6, 1988, now abandoned.

The invention relates to a granular plastic composite containing metal fibers and to plastic articles made therefrom.

In the manufacture and shaping of plastic articles, plastic granules containing additives are often used, whereby these master batch granules are then plastified and mixed intensively with an amount of resin thus forming a viscous mass. This viscous mass can then be shaped into articles by extrusion and/or molding.

Applicant's U.K. Patent 2.150.936 describes the production of a granular composite containing electrically conductive fibers, e.g. stainless steel fibers. Such a composite can be used for the shaping of thermoplastic articles with antistatic properties or shielding properties against electromagnetic radiation. According to this patent, the content of which is incorporated by reference in the present application, fibers are introduced into and uniformly distributed through a plastic by using an intermediate granular composite. In order to attain a reasonable shielding efficiency with a low fiber content (vol. %) in the plastic articles, it is important that during the dispersion a relatively high fiber length L and in particular a high L/D-ratio ($\geq 100$), where D stands for the equivalent diameter of the conductive fibers, are maintained.

In practice, this means that excessive fiber breakage during the processing into the plastic must be avoided in order to maintain a high L or L/D-value. In addition to these conductive fibers, non-conductive fibers, such as glass fibers, can also be introduced in the form of a granular composite to reinforce the plastic.

Although the dispersion attained according to this patent is good, the injection molding process conditions must be controlled very accurately. In particular, the shear forces in the warm, plastified mass to be injection molded must be controlled to achieve a sufficiently uniform dispersion without excessive fiber breakage. This causes the rate of production according to this patent to be relatively low.

Applicant's U.S. Pat. No. 4,788,104 proposes the introduction of a crimping wave into the fibers by means of gear crimping. (The content of this application is incorporated by reference into the present application). The voluminous fiber bundle thus obtained is embedded into plastic and the composite strand thus obtained is chopped into granular composite. The loose packing of the fibers in this granulate leads to a more easy dispersion of the fibers through the plastic during the hot plasticising and compounding of a mixture of plain resin granules with the aforementioned composite granules. The injection molding process conditions can then be chosen within considerably wider limits and still lead to a good dispersion.

In addition to achieving an effective fiber dispersion, it is also necessary to maintain maximum shielding efficiency over the widest possible frequency range under a variety of molding conditions (e.g. higher injection molding pressures or higher speed of injection) while maintaining the lowest possible volume % of fibers in the molded plastic article. This means that the aim is to come as close as possible to a substantially continuously conductive network of fibers in the plastic at the lowest possible fiber content. High L and L/D-values certainly contribute in this respect, especially at lower frequencies. These values will also be fostered by an increased fiber tensile strength, an increased bending strength and increased resistance to torque. It is, however, equally important that the fibers should also have the greatest possible effective length "l". This effective length l will normally approach L, to the extent that the fibers have been embedded more or less straightened into the plastic. In practice this implies the use of fibers with a relatively high bending stiffness. This stiffness can be increased by choosing a larger fiber diameter but this choice is limited by the necessity to maintain appropriate L/D-values which will normally be between 100 and 2000. An increase in the intrinsic bending stiffness (modulus) of the fiber material will therefore generally have a favourable effect.

It is therefore an object of the present invention to provide a granular composite for incorporation into resins, which granular composite is obtained by chopping granules from a composite strand containing metal fibers embedded as bundles in a plastic polymer and whereby a very good electromagnetic shielding efficiency (e.g. $\geq 35$ dB E-field shielding at fiber concentrations below 1%) can be realized at high as well as at low frequencies (50 Hz to 10 GHz) under widely different processing conditions. As described above, this implies amongst other things the maintenance of high L, L/D and l-values of the dispersed fibers.

According to the present invention this object is achieved by using metal fibers comprising a hardened material (which is preferably hardened by plastic deformation), derived from an austenitic ferric alloy in which at least 75% of the austenite has been converted into martensite.

In general, the invention thus provides for conductive fibers to be incorporated into nonconductive or poorly conductive materials, whereby the fibers contain hardened material derived from an austenitic ferric alloy in which at least 75% of the austenite has been converted into martensite.

More in particular, the hardened material will be a stainless steel alloy, viz. an austenitic Fe/Cr/Ni-steel (18-8 types as for instance the series 302, 347, 308 and 316) in which the conversion into at least 75% martensite has been realized by (cold), plastic deformation. It has been found that in order to achieve a sufficiently high shielding efficiency according to the invention under a wide range of processing conditions and over a broad frequency range, at least 75% and preferably at least 80%, 85% or often even more than 90% martensite is desirable. It is to be noted that an increased martensite content will also increase the breaking strength and thus favour the L and L/D-values. Similarly, a higher martensite content may also increase the stiffness to a certain extent and thus also the l-values.

In order to guarantee an almost constant bending stiffness in the fibers, the cross section of these fibers will preferably remain almost constant over their entire length and also be as round (circular) as possible. The cross section can for instance be an almost regular polygon, for instance a hexagon. A constant and near-circular cross section also favourably affects the achievement of a regular and almost smooth fiber surface, which is a desirable characteristic.

The L and L/D-values can also be increased by using relatively pure metals, i.e. metals or alloys that are almost free from non deformable inclusions with a grain size of 3 microns or more. Indeed fiber breakage is often observed to occur close to such inclusions.

It has also been found to be important to use fibers having a surface with a good conductivity, which is for instance little or poorly oxidized. Indeed the contact or transition resistance between adjacent fibers increases considerably when their surfaces have or acquire a low conductivity. (This happens for instance with Al-fibers which acquire a strongly isolating $Al_2O_3$-sheath by oxidation.)

An increase in fiber diameter will in general also cause a desirable increase in stiffness. Nevertheless, the equivalent fiber diameter D will preferably be chosen below 15 microns in order not to disturb the homogeneity of the plastic matrix and thus its mechanical and physical properties. Preferred diameters are in the 4 to 12 micron range.

The strand according to the invention contains between 500 and 35000 fibers as bundles. The shear forces acting during the hot processing cause the gradual release of the fibers from the bundle, first at the outside of the bundle and then gradually towards its center. Subsequently the released fibers are distributed and dispersed through the plastic matrix. The detached fibers will, however, show a tendency to break up (possibly into fine dust) when the shear forces are maintained for too long a period of time or are too severe or too strong. Although this leads to an improved appearance of the shaped article (absence of fiber clusters) it also causes an undesirable reduction of shielding efficiency.

A very thin bundle will be released more quickly and thus be more susceptible to fiber breakage. If, on the other hand, very thick bundles are used, the outer fibers of the bundle may be released and thus become dispersed and susceptible to fiber breakage before the bundle core fibers have been released. This also leads to uncontrolled changes in L and L/D-values during processing and affects the shielding efficiency. Easy release and dispersion of the bundle will also depend upon the cross section shape of the bundle. A circular bundle will in general be released more slowly than a flat, striplike bundle with a smaller thickness than width. In addition to the bundle thickness, other significant factors are fiber strength, fiber length in the granulate chopped from the strand and the degree of compactness of the packing of the fibers therein, as well as the amount (volume %) in the resin and its melt viscosity.

The desirable fiber hardening and fiber strength have already been dealt with. The length of the chopped granulate will preferably be between 2.5 and 10 mm, which is thus also substantially the length of the fibers embedded therein and extending from one end of the granule to the opposite end.

If the granular composite according to the invention contains a thermoplastic resin, it can be dry mixed with (an)other thermoplastic resin (e.g. pellets) in a ratio according to a predetermined content of conductive fibers. This mixture can then be fed to plastification equipment and after hot working it can be shaped in the usual manner into a plastic article (master batch). The conductive fibers are then distributed as evenly as possible throughout the entire article or only through predetermined parts thereof. The length of the composite granules is then preferably between 2.5 and 6 mm.

Shaping can be done by injection molding, extrusion, pultrusion, compression molding etc.

If desired it is also possible to extrude the hot mass into a new strand containing the fibers distributed in it. This compounded strand can again be chopped to form compounded granulate to be dry mixed with other resin granulate. This mixture can then be hot worked and fed to shaping equipment or a mold as described above, for the manufacture of more or less conductive plastic articles. If the pre-compounding route (with compounded granulate) is chosen, the length of the initial composite granulate is preferably between 4 and 8 mm.

The use of at least one gear crimped fiber subbundle in the strand allows the compactness of the fiber arrangement in the strand and the (composite) granulate to be controlled. According to the teaching of the abovementioned U.S. Pat. No. 4,788,104 the crimp can be an almost sinusoidal zigzag crimp with a wave length W between 2 and 30 mm (and preferably between 4 and 20 mm) and an amplitude A between 0.2 and 7 mm, whereby $W/A > 2$ and preferably $\geq 4$. The crimp wave can also consist of a number of superimposed zigzag crimps. The voluminosity of the bundle can also be influenced for example by combining a number of bundles with different crimp characteristics in the same strand. Further, metal fibers can be combined in the same strand with other fibers, either non-conductive fibers (e.g. glass fibers) or fibers with a conductivity of less than 0.5% of the copper standard (e.g. carbon fibers). Multifilament bundles or staple fiber slivers can be used alone or in combination.

The resin content in the strand must be between 20 and 80 volume percent. Resin volumes below 20% entail the risk of producing a fragile strand with too little cohesion, whereas resin volumes above 80% would have little effect and may even retard the gradual release and dispersion of the fibers. Naturally, the resin in the strand must be chemically substantially compatible with the main resin component of the article to be shaped. Thus, the resin in the strand is preferably the same or substantially the same as the article's main resin component.

In order to encourage a rapid dispersion, the strand polymer preferably has a relatively low melt viscosity, preferably lower than the melt viscosity of the main resin component of the article to be shaped. The strand polymer preferably also has good filmforming properties. In certain cases it can also have almost the same composition as the main resin component, for instance when thin bundles ($\pm 1000$ filaments) are used. Plasticisers and/or lubricants can also be added to improve the fluidity properties during processing.

If so desired, very finely divided highly polar organic compounds or conductive materials can be added to the strand. These encourage the formation of electrically conducting bridges between adjacent dispersed fibers in the article. These compounds or materials may thus compensate the presence of poorly conductive metal oxides on the fiber surfaces. Similarly, the addition to the polymer of the strand of certain coupling, bonding or wetting agents, such as silanes, titanates and zirconates can be considered in order to control the adhesion of the fiber surfaces to the polymer matrix into which these fibers are to be dispersed. These additives may exert a favourable influence on the ageing properties of the plastic articles. (In this context ageing includes the decrease of the shielding efficiency with time and/or changes in temperature.

The abovementioned finely divided conductive or polar compounds (possibly in combination with antioxidants, coupling agents or wetting agents) can also be chosen so as to achieve an improved corrosion resistance and better fluidity properties in addition to improved electrical conductivity and adhesion. If so desired, attempts can be made to chemically convert poorly conductive oxides on the fiber surfaces by the coupling agents to encourage the formation of a conductive bridge from the fiber to the polymer matrix.

Finally, the resin impregnated bundles as described above may be extrusion coated with a further polymer layer, which layer may have the same or substantially the same composition as the polymer used for the impregnation of the fiber bundles. This additional polymer may in certain cases also have the same or substantially the same composition as the main polymer constituent of the plastic article, if for instance polycarbonate resin is used. Similarly, the composition of the impregnating resin of the fiber bundles may correspond to the main polymer of the plastic article and said fiber bundle may be optionally coated with a layer of the same polymer.

EXAMPLE 1

A number of different resin compositions were prepared by mixing resin granulate with granular composite according to the invention for the injection molding of plastic articles with electromagnetic shielding properties over a wide frequency range.

The granular composite mentioned above was prepared substantially as in example 1 of the aforementioned U.K. patent. Each granule contained gear crimped stainless steel filaments embedded in a linear polyester (Dynapol L850) and a sheath of a modified alkyd resin with good fluidity properties. The crimp in the gear crimped filaments was attained by superimposition of two zigzag waves with wave lengths of 7.5 and 5 mm and amplitudes of 1 and 0.7 mm respectively. The cylindrical composite strand had a diameter of about 2 mm and a metal fiber content of about 30 vol. %. It was chopped into 4 mm long composite granules. Subsequently, this granulate was dry mixed with the usual ABS-resin based granules (RONFALIN VE-30 ®)) to give a master batch mixture containing 1 vol. % metal fibers. The mixture was fed to a Stubbe injection molding machine as described in example 6 of the aforementioned U.K. patent. The extrusion nozzle temperature was controlled at 220°-240° C. and the screw speed was 70 rpm and 100 rpm respectively. The injection molded square plaques (150×150 mm) had a thickness of 3 mm. Four Fe/Cr/Ni-stainless fiber types with different martensite contents (%) were used: Table 1.

TABLE 1

| Sample No. | Steel type | Mart. % | Composite granulate D (micron) | No. fibers |
|---|---|---|---|---|
| 1 | 316 L | 77 | 10 | 8000 |
| 2 | 316 L | 76 | 10 | 8000 |
| 3 | 316 L | 92 | 8 | 12000 |
| 4 | 302 | 93 | 8 | 12000 |
| 5 | 304 | 45.6 | 8 | 12000 |
| 6 | 316 L | 78 | 10 | 8000 |
| 7 | 302 | 87 | 8 | 12000 |
| 8 | 302 | 86 | 10 | 8000 |
| 9 | 316 L | 85 | 8 | 10000 |
| 10 | 316 L | 89 | 8 | 10000 |

The 316 L-alloys had a high degree of purity: they contained few non-deformable inclusions. Amongst the Fe/Cr/Ni-alloys those with a relatively low Ni-content ($\leq 10.5\%$) will generally be preferred, because they form more readily martensite during the plastic deformation process during fiber manufacture. The plastic deformation and hardening are preferably introduced during manufacture by a process of bundle drawing as described e.g. in U.S. Pat. Nos. 2,050,298 or 3,277,564. It is known that high martensite rates can then be obtained by an appropriate choice of the drawing parameters, such as temperature, number of drawing stages, reduction per drawing stage and final reduction as well as in function of the alloy composition.

The martensite contents were determined in the usual manner, by measuring the ferromagnetic character, i.e. the volume percentage of ferromagnetic material in the fiber, using a sigmameter B3513. For this purpose, the fibers were magnetized to saturation and suddenly removed from the magnetic field, thus causing an inductioncurrent to be generated in nearby coils, which current is recorded by a ballistic galvanometer. From this record the proportion ferro-magnetic material in the fiber mass can be deduced.

The reflection values (observed during microwave measurements at 10 GHz in the far field) have been recorded in Table 2 for several plasticising pressures and screw speeds.

TABLE 2

| Plasticising pressure N/cm$^2$ | Screw speed rpm | R (%) per sample number | | | | | | | | | |
|---|---|---|---|---|---|---|---|---|---|---|---|
| | | 1 | 2 | 3 | 4 | 5 | 6 | 7 | 8 | 9 | 10 |
| 2.0 | 70 | — | — | 90 | — | — | 87 | — | — | — | — |
| 2.5 | 70 | 88 | 87 | — | 91 | 85 | — | 90 | 88 | 88 | 90 |
| 3.0 | 70 | — | — | — | — | — | 86 | — | — | — | — |
| 3.5 | 70 | 86 | 87 | 90 | 90 | 84 | — | 90 | 88 | 89 | 90 |
| 4.0 | 70 | — | — | — | — | — | 83 | — | — | — | — |
| 4.5 | 70 | — | — | — | 91 | 82 | — | 91 | 87 | 82 | 89 |
| 4.5 | 100 | — | 86 | 90 | — | — | — | — | — | — | — |
| 5.0 | 70 | — | — | — | — | — | 74 | — | — | — | — |
| 5.5 | 70 | — | — | — | — | — | — | — | — | 80 | 88 |
| 5.5 | 100 | 82 | — | — | 93 | 88 | — | 90 | 87 | 77 | 86 |

Table 2 reveals that sample numbers 3, 4, 7 and 10 with 8 micro fibers and with martensite contents from 87% onwards show on average the highest reflection values. It should also be noted that the reflection values of the high martensite content samples are the best for high as well as low plasticising pressures. Further they decrease on average less rapidly with increasing shear forces than for low martensite content samples.

The introduction and dispersion into non- or poorly conductive substances of hardened metal fibers according to the invention need not necessarily be achieved by the addition of composite granulate as described above. It can also be introduced by means of a woven, knitted or non-woven structure. A mixture of metal fibers and other fibers can thereby be used. The other fibers can comprise then low melting polymers.

On intruduction into plastics and subsequent hot shaping, the low melting polymer will then fuse and flow with the (compatible) main resin of the intended conductive composite article.

Although the invention recommends metal fibers derived from austenitic ferric alloys with high martensite content, a favourable shielding effect from the use of hardened ferritic Fe/Cr-alloys (e.g. from the 430 series), or of martensitic Fe/Cr-alloys (e.g. from the 410 or 416 series) or of other hardened ferromagnetic alloys may not be excluded.

We claim:

1. A composite strand for improving the electromagnetic shielding efficiency of a plastics article having a main resin component, said strand comprising metal fibers embedded as bundles in a polymer, said strand containing said polymer in an amount between 20 to 80 volume percent, wherein (i) said metal fibers are formed of a metal derived from an austenitic stainless Fe/Cr/Ni-steel alloy, (ii) the austenite present in said alloy has been converted by plastic deformation into the martensite in an amount of at least 85 volume percent, and (iii) at least one of said bundles in said strand is a gear crimped bundle to facilitate even dispersion of said metal fibers throughout the plastics article thereby imparting improved electromagnetic shielding efficiency thereto.

2. A strand according to claim 1, in which at least 90% of the austenite has been converted into martensite.

3. A strand according to claim 1, in which the fibers have an almost constant and near-circular cross section.

4. A strand according to claim 1, in which the metal is almost free from non deformable inclusions with a grain size of more than 3 microns.

5. A strand according to claim 1, in which the fibers have a surface with a good conductivity.

6. A strand according to claim 1, in which fibers have an equivalent diameter D of not more than 15 microns.

7. A strand according to claim 1, in which the bundle contains between 500 and 35 000 fibers.

8. A strand according to claim 1, further comprising other fibers in addition to said metal fibers.

9. A strand according to claim 8, in which at least part of said other fibers are non-conductive.

10. A strand according to claim 8, in which at least part of said other fibers are conductive and have a conductivity lower than 0.5% of the copper standard.

11. A strand according to claim 1, in which the polymer has a relatively low melt viscosity.

12. A strand according to claim 1, wherein the polymer in which said metal fibers are embedded is the same or substantially the same as the main resin component of the plastic article.

13. A strand according to claim 1, in which the polymer contains very finely divided, electrically conductive materials.

14. A strand according to claim 1, in which the polymer contains at least one coupling agent.

15. A stand according to claim 1, wherein said strand contains a number of polymer impregnated fiber bundles, said strand being coated with an additional polymer layer.

16. A strand according to claim 15, wherein the additional polymer layer has the same or substantially the same composition as the polymer used for impregnating the bundles.

17. A strand according to claim 15, wherein the additional polymer layer has the same or substantially the same composition as the main resin component of the plastic article.

18. A strand according to claim 1, in which the width of said strand is larger than its thickness.

19. A granular composite obtained by chopping granules from a strand according to claim 1, in which the fibers predominantly extend from one end of the granule to the opposite end.

20. A molding compound for use in forming shaped plastic articles, comprising a mixture of a granular composite according to claim 19, and another polymer granulate.

21. A plastic article obtained shaping the compound according to claim 20, in which the conductive fibers are evenly distributed at least throughout predetermined parts of the article.

22. A plastic article as a claim 21, wherein the conductive fibers are evenly distributed throughout the entire article.

* * * * *